(12) United States Patent
Hayashizaki et al.

(10) Patent No.: US 7,862,733 B2
(45) Date of Patent: Jan. 4, 2011

(54) METHOD FOR MANUFACTURING A PROBE

(75) Inventors: Takayuki Hayashizaki, Aomori (JP); Hideki Hirakawa, Aomori (JP); Akira Soma, Aomori (JP); Kazuhito Hamada, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 595 days.

(21) Appl. No.: 11/960,502

(22) Filed: Dec. 19, 2007

(65) Prior Publication Data
US 2008/0210663 A1 Sep. 4, 2008

(30) Foreign Application Priority Data
Jan. 5, 2007 (JP) .............................. 2007-000651

(51) Int. Cl.
B44C 1/22 (2006.01)
(52) U.S. Cl. .............................. 216/11; 216/12; 216/39
(58) Field of Classification Search ........................ None
See application file for complete search history.

(56) References Cited

U.S. PATENT DOCUMENTS

| | | | | |
|---|---|---|---|---|
| 5,883,387 A * | 3/1999 | Matsuyama et al. | ........... | 850/59 |
| 6,358,426 B1 * | 3/2002 | Muramatsu et al. | ........... | 216/11 |
| 6,672,875 B1 * | 1/2004 | Mathieu et al. | ............... | 439/66 |
| 6,939,474 B2 * | 9/2005 | Eldridge et al. | ............... | 216/11 |
| 7,048,548 B2 * | 5/2006 | Mathieu et al. | ............... | 439/66 |
| 7,151,385 B2 * | 12/2006 | Hirata et al. | ................. | 324/754 |
| 7,285,966 B2 * | 10/2007 | Lee et al. | ..................... | 324/754 |
| 7,412,767 B2 * | 8/2008 | Kim et al. | ..................... | 29/879 |
| 7,459,399 B2 * | 12/2008 | Kim et al. | ................... | 438/694 |
| 7,523,539 B2 * | 4/2009 | Hayashizaki et al. | .......... | 29/595 |
| 7,586,321 B2 * | 9/2009 | Hirakawa et al. | ........... | 324/762 |

(Continued)

FOREIGN PATENT DOCUMENTS

JP 10221369 8/1998

(Continued)

OTHER PUBLICATIONS

Office Action for KR 2007-133466, Jul. 28, 2009, Kabushiki Kaisha Nihon Micronics.

*Primary Examiner*—Allan Olsen
(74) *Attorney, Agent, or Firm*—Ingrassia Fisher & Lorenz, P.C.

(57) ABSTRACT

The present invention provides a probe manufacturing method in which, after a metal material for a probe is deposited on a base table, the probe can be detached from the base table relatively easily. A sacrificial layer is formed on a base table. The sacrificial layer is partially removed so as to form a recess in the sacrificial layer. A mask that exposes an area formed in a desired probe flat surface shape containing the recess is formed on the sacrificial layer. A probe material exhibiting different etching resistance characteristics from those of the sacrificial layer is deposited in the area exposed from the mask. By the deposition of the material, a coupling portion corresponding to the recess and a probe that is integral with the coupling portion are formed. After the mask is removed, the sacrificial layer is removed with use of etchant. Thereafter, the probe held on the base table at the coupling portion is detached from the base table together with the coupling portion.

10 Claims, 6 Drawing Sheets

U.S. PATENT DOCUMENTS

| | | | |
|---|---|---|---|
| 7,678,587 B2* | 3/2010 | Kim et al. | 438/14 |
| 7,737,714 B2* | 6/2010 | Hsu | 324/762 |
| 2003/0119221 A1* | 6/2003 | Cunningham et al. | 438/52 |
| 2005/0221644 A1* | 10/2005 | Kim et al. | 439/81 |
| 2006/0019027 A1* | 1/2006 | Eldridge et al. | 427/96.8 |
| 2006/0073627 A1* | 4/2006 | Park et al. | 438/52 |
| 2006/0132153 A1* | 6/2006 | Gritters | 324/754 |
| 2006/0192581 A1* | 8/2006 | Lee | 324/762 |
| 2007/0152685 A1* | 7/2007 | Eldridge et al. | 324/754 |
| 2007/0247175 A1* | 10/2007 | Khandros et al. | 324/754 |
| 2007/0279043 A1* | 12/2007 | Takahashi | 324/149 |
| 2007/0296435 A1* | 12/2007 | Eldridge et al. | 324/761 |
| 2008/0048687 A1* | 2/2008 | Jung | 324/754 |
| 2008/0079453 A1* | 4/2008 | Lee | 324/762 |
| 2008/0111573 A1* | 5/2008 | Chen et al. | 324/761 |
| 2008/0142709 A1* | 6/2008 | Sumant et al. | 250/306 |
| 2008/0143368 A1* | 6/2008 | Hayashizaki et al. | 324/762 |
| 2008/0186041 A1* | 8/2008 | Lee | 324/762 |
| 2010/0155253 A1* | 6/2010 | Kim et al. | 205/122 |

FOREIGN PATENT DOCUMENTS

| | | |
|---|---|---|
| JP | 2000-162241 | 6/2000 |
| KR | 1020060021420 A | 3/2006 |
| WO | WO 2004/102207 A1 | 11/2004 |

* cited by examiner

METHOD FOR MANUFACTURING A PROBE

BACKGROUND OF THE INVENTION

The present invention relates to a probe used in an electrical test of a device under test such as a semiconductor integrated circuit (hereinafter referred to as IC) and a method for manufacturing the same.

A plurality of ICs formed on a semiconductor wafer generally undergo an electrical test before being separated into respective chips to determine whether or not they are manufactured in accordance with the specification. The electrical test of this kind can be performed by using a probe assembly comprising a probe substrate and a plurality of probes attached to the probe substrate (e.g., refer to Patent Documents 1 and 2).

The probe of such a probe assembly is formed by using a silicon wafer as a base table, taking the flat form of the probe with a resist mask on the base table by making use of a photolithographic technique, sequentially depositing metal materials in the recess on the base table formed by the resist mask to form the probe, and thereafter detaching the probe from the base table, as described in Patent Document 1.

To detach the probe from the silicon base table, an etching technique is utilized. For prevention of damage on the probe caused by the etching and easy detachment of the probe, a sacrificial layer made of a metal material such as copper different from the probe material is formed on the base table, and the probe material is deposited on the sacrificial layer. Thus, by removing the sacrificial layer by means of, for example, wet etching with etchant, the probe can be detached from the silicon base table.

However, when the probe is soaked in the etchant until the sacrificial layer is completely removed, the probe itself may be damaged by the etchant. Also, since a plurality of micro probes are formed integrally on the base table, the plurality of micro probes may float on the etchant by the etching, in which case it is difficult to handle them.

Accordingly, it is preferable to finish the etching process without giving substantial damage on the probe itself by the etchant and in a state where the minimum and proper amount of sacrificial layer remains between the silicon base table and the probe required to achieve easy detachment of the probe and to hold the probe on the silicon base table.

After the etching process in which the proper amount of sacrificial layer has remained, the probe can be detached by an external force with use of a tool such as a cutter knife or a spatula. However, if a large amount of sacrificial layer remains due to insufficiency of the etching process time, detachment of the probe attached to the silicon base table by the remaining large amount of sacrificial layer requires a strong force, and thus such a process may deform the probe.

For these reasons, it has been necessary to keep observing the etching process for detachment of the probe from the base table for a relatively long time so that the etching process is performed appropriately, and the manufacturing process has been complicated in some cases. Thus, a novel manufacturing method that enables time reduction and simplification of the probe manufacturing process has been desired.

Patent Document 1: Japanese Patent Appln. Public Disclosure No. 2000-162241; Patent Document 2: International Publication WO2004/102207 Pamphlet

BRIEF SUMMARY OF THE INVENTION

It is an object of the present invention to provide a probe manufacturing method enabling relatively easy detachment of a probe from a base table, after a material for the probe is deposited on the base table, without giving damage on the probe formed by the deposition.

A probe manufacturing method according to the present invention comprises the steps of forming a sacrificial layer on a base table, partially removing the sacrificial layer so as to form a recess in the sacrificial layer, forming on the sacrificial layer a mask that exposes an area formed in a desired probe flat surface shape containing the recess on the sacrificial layer, and depositing in the area exposed from the mask a probe material exhibiting different etching resistance characteristics from those of the sacrificial layer. By the deposition of the probe material in the area, a coupling portion corresponding to the recess and a probe that is integral with the coupling portion are formed. Thereafter, the mask is removed, and further the sacrificial layer is removed with use of etchant. Accordingly, the probe held at the coupling portion is formed on the base table, and the probe is detached from the base table together with the coupling portion.

In the probe manufacturing method according to the present invention, the coupling portion formed corresponding to the recess formed in the sacrificial layer is made of a material that exhibits different etching resistance characteristics from those of the sacrificial layer. Thus, when the sacrificial layer is to be removed by the etching process, using etchant against which the probe material exhibits more excellent etching resistance characteristics than the sacrificial layer does will prevent the coupling portion from being etched by the etchant as much as the sacrificial layer as in a conventional case and enable to leave the predetermined coupling portion relatively easily.

Thus, according to the present invention, when the sacrificial layer is to be removed by the etching process, it is possible to leave the proper amount of coupling portion and to hold the probe on the base table at the coupling portion. This will not cause the plurality of probes to float on the etchant by removal of the coupling portion, and it is possible to detach the proper amount of coupling portion for detachment from the base table relatively easily with use of a tool such as a cutter knife.

Prior to formation of the sacrificial layer on the base table, an adhesive layer that promotes growth of the sacrificial layer may be formed on the base table. In such a case, the recess formed in the sacrificial layer exposes the adhesive layer at the bottom of the recess.

Thus, in a case where the adhesive layer is used, the coupling portion is supported on the base table via the adhesive layer exposed on the bottom of the recess.

The mask may be formed by selective exposure and development of a photomask layer made of a photomask material.

As the probe material, nickel or nickel alloy may be used. Also, the sacrificial layer may be made of copper. In such a case, etchant consisting primarily of tetra amine copper chloride may be used as the etchant.

With the method according to the present invention, an entirely plate-shaped probe comprising an attachment portion having an attachment end to a probe substrate, an arm portion extending in a lateral direction from the attachment portion, and a probe tip portion extending to an opposite side of a side where the attachment end of the attachment portion is located and provided with a probe tip at its tip end can be formed.

As the coupling portion, a first stem portion may be formed at a part corresponding to the attachment portion of the probe.

A second stem portion may be further formed at a part corresponding to the probe tip portion of the probe. It is preferable that the flat surface shape of the second stem portion is smaller than the flat surface shape of the first stem portion formed at a part corresponding to the attachment portion.

After the etching process removing the sacrificial layer by the etchant, the probe material may undergo heat treatment in a state where the probe is supported on the base table at two points by the both stem portions.

After the heat treatment, the second stem portion may be removed by an etching process. Thus, by detaching the remaining first stem portion from the base table, the probe can be detached from the base table. By holding the probe at the two points for the first and second stem portions during the heat treatment, it is possible to prevent retroflexion caused by the heat treatment from being introduced to the probe.

According to the present invention, since the coupling portion is made of a material that exhibits more excellent etching resistance characteristics than the sacrificial layer does, as described above, the sacrificial layer can be removed relatively easily with this coupling portion remaining. Accordingly, since it is possible to detach the probe from the base table relatively easily without letting the probes detached from the base table by the etching process and without giving damage on the probe at the time of detachment, the probe can be manufactured more easily than in the conventional case.

DESCRIPTION OF THE PREFERRED EMBODIMENTS

Figure 1:
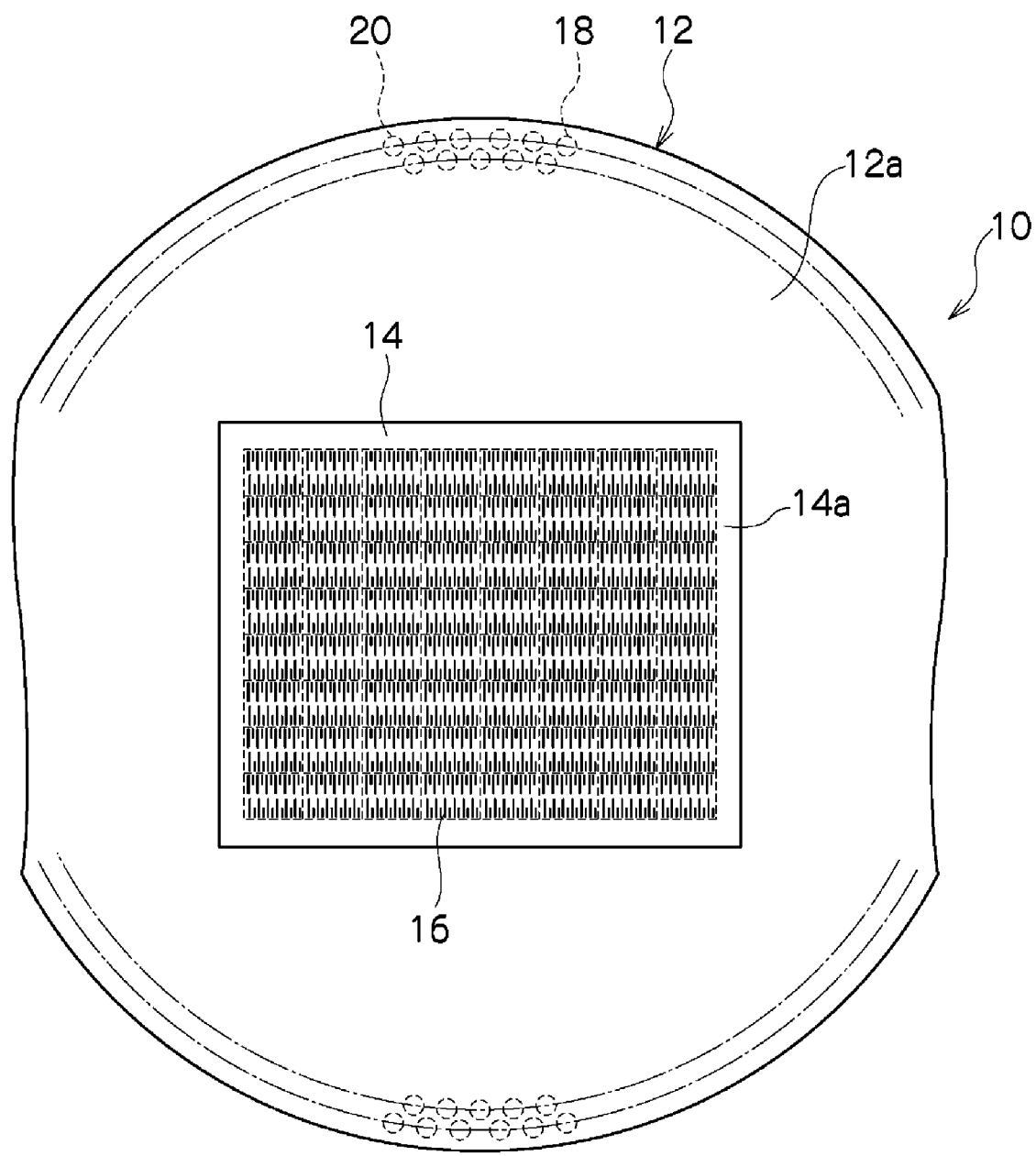
FIG. 1 is a bottom view showing a probe assembly according to the present invention.
Figure 2:
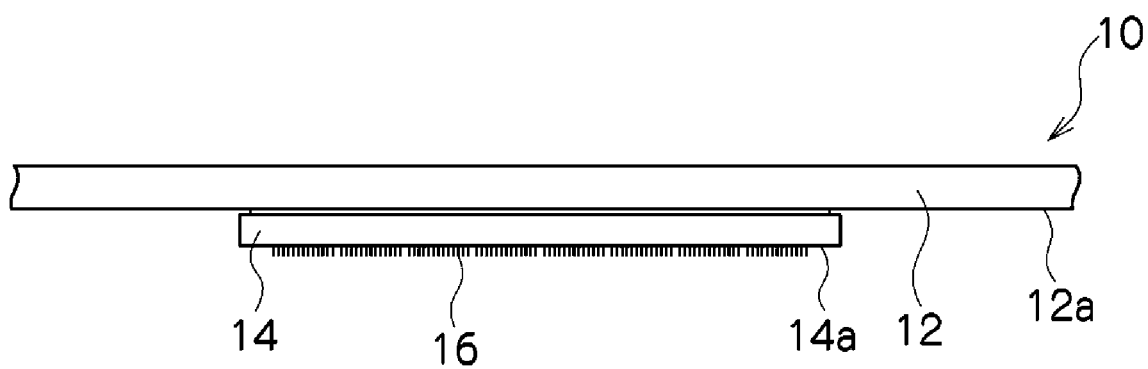
FIG. 2 is a front view showing the probe assembly shown in FIG. 1.
Figure 3:
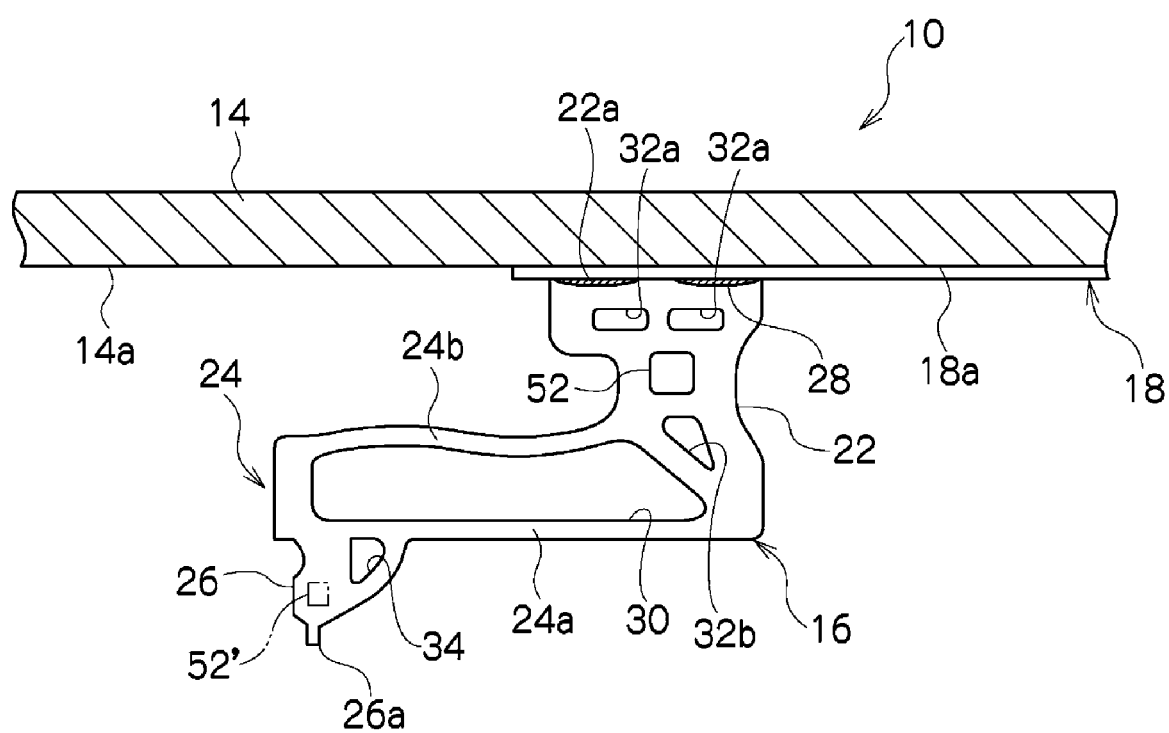
FIG. 3 is a front view of a probe, which is a partial enlarged view of the probe assembly shown in FIG. 1.
Figure 4:
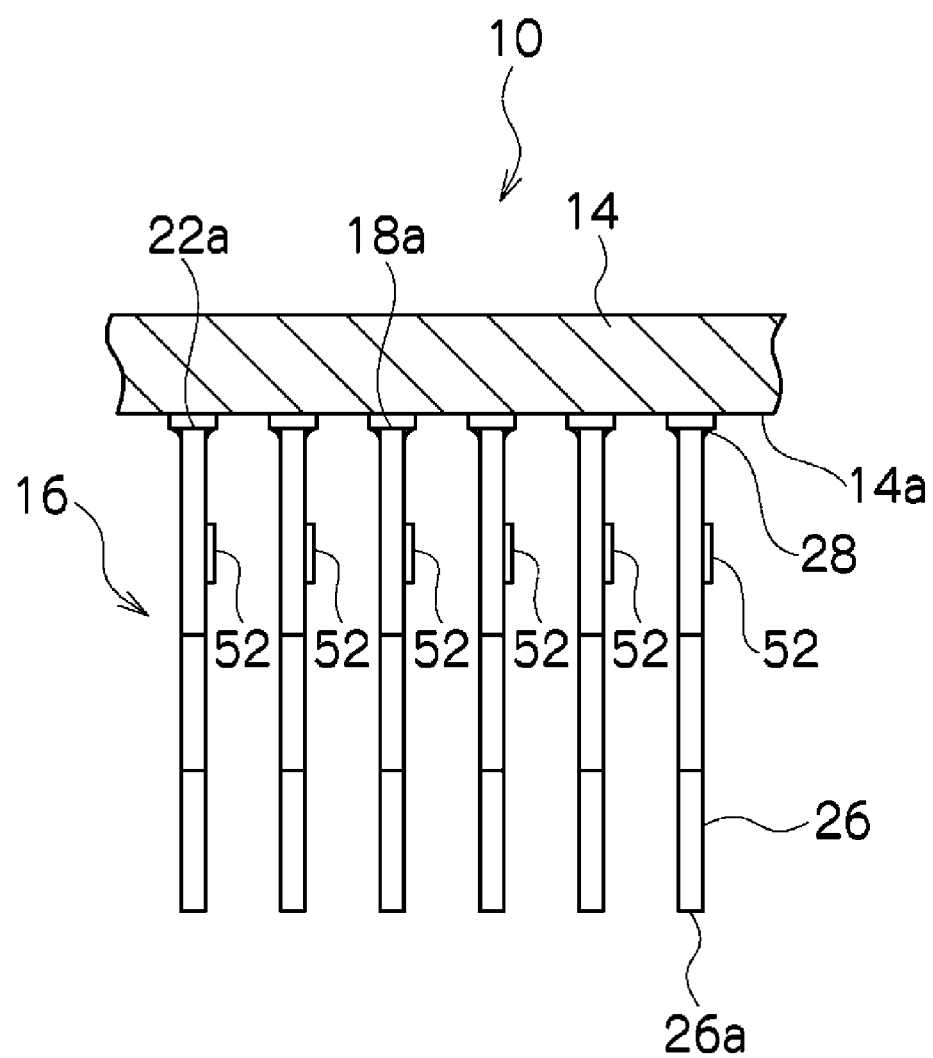
FIG. 4 is a side view of the probes, one of which is shown in FIG. 3, which is a partial enlarged view of the probe assembly shown in FIG. 1.

A probe assembly 10 according to the present invention comprises an entirely round wiring board 12, a probe substrate 14 attached to the center portion of a lower surface 12a of the wiring board and formed in a rectangular flat shape, and a plurality of probes 16 attached to one surface 14a of the probe substrate, as shown in FIGS. 1 and 2. Each probe 16 is fixed to each anchor portion 18a of a corresponding conductive path 18 formed on one surface 14a of the probe substrate 14, as shown in FIGS. 3 and 4. The probe substrate 14 is fixed to the wiring board in a state where the other surface opposite one surface 14a on which the probes 16 are provided is faced to the lower surface 12a of the wiring board 12.

The wiring board 12 is an electrically insulated board into which not shown conductive paths are incorporated, as is conventionally well known. As shown in FIG. 1, at the rim portion on the upper surface of the wiring board 12 are provided a plurality of tester lands 20 that are connection ends to a not shown tester main body. Each probe 16 of the probe substrate 14 attached to the wiring board 12 is electrically connected to each corresponding tester land 20 via the corresponding conductive path 18 of the probe substrate 14 and the aforementioned corresponding conductive path in the wiring board 12, in a similar manner as in a conventional case. Accordingly, each probe 16 is electrically connected to the aforementioned tester main body via the corresponding tester land 20.

FIGS. 3 and 4 show one example of the probe 16 according to the present invention. The probe 16 according to the present invention is formed in an entirely flat-plate shape. The probe 16 comprises an attachment portion 22 having an attachment end 22a to the anchor portion 18a provided on the probe substrate 14, an arm portion 24 extending in a lateral direction from the lower end of the attachment portion, and a probe tip portion 26 extending downward from the tip end of the arm portion, and a probe tip 26a is formed at the tip end of the probe tip portion.

In the example shown in the figures, the probe 16 is fixed to the anchor portion 18a of the corresponding conductive path 18 of the probe substrate 14 at the attachment end 22a of the attachment portion 22 via solder 28. The attachment end 22a is formed in an entirely waved shape so as to secure void spaces for holding the solder 28 between the attachment end and the anchor portion 18a, as shown in FIG. 3. This attachment end 22a may be configured to be a flat surface.

The arm portion 24 has a pair of arm portions 24a, 24b spaced from and parallel to each other between the attachment portion 22 and the probe tip portion 26. In the example shown in the figures, the lower arm portion 24a extends in a lateral direction along a straight line while the upper arm portion 24b extends in a lateral direction in an entirely waved form meandering in an up-down direction. Between the arm portions 24a and 24b is formed a space 30 penetrating the probe 16 in its plate thickness direction. Besides, many openings 32 (32a, 32a, 32b) penetrating the probe 16 in its plate thickness direction are also formed at the attachment portion 22. Further, at the probe tip portion 26 is formed an opening 34 penetrating the probe 16 in its plate thickness direction.

Although the space 30 may be eliminated, it is preferable to form the arm portion 24 by the arm portions 24a, 24b separated by the space 30 as shown in the figures for the purpose of applying appropriate elasticity to the arm portion 24 when the probe 16 is thrust to a device under test. Also, although the opening 34 at the probe tip portion 26 may be eliminated, it is preferable to form the opening 34 for the similar purpose of applying appropriate flexibility to the probe tip portion 26.

Each opening 32 (32a, 32a) may be eliminated. However, it is preferable to appropriately form the openings 32 at the attachment portion 22 for the purpose of promoting removal of a sacrificial layer by an etching process in steps for manufacturing the probe 16 described later.

The probe tip 26a of the probe 16 is thrust to an electrode of a device under test for an electrical test of the device under test such as an IC circuit using the aforementioned tester. At this moment, the probe tip 26a of the probe 16 is reliably connected to the aforementioned electrode with appropriate elasticity due to flexible deformation of the arm portions 24a, 24b or the probe tip portion 26.

Figure 5:
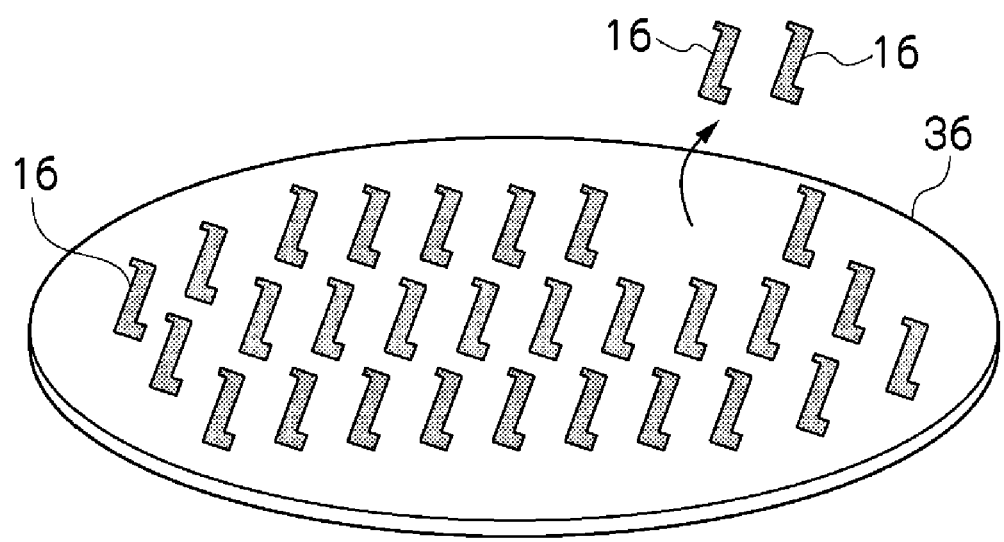
FIG. 5 is a perspective view showing a process of detaching a probe according to the present invention from a base table.
Figure 6:
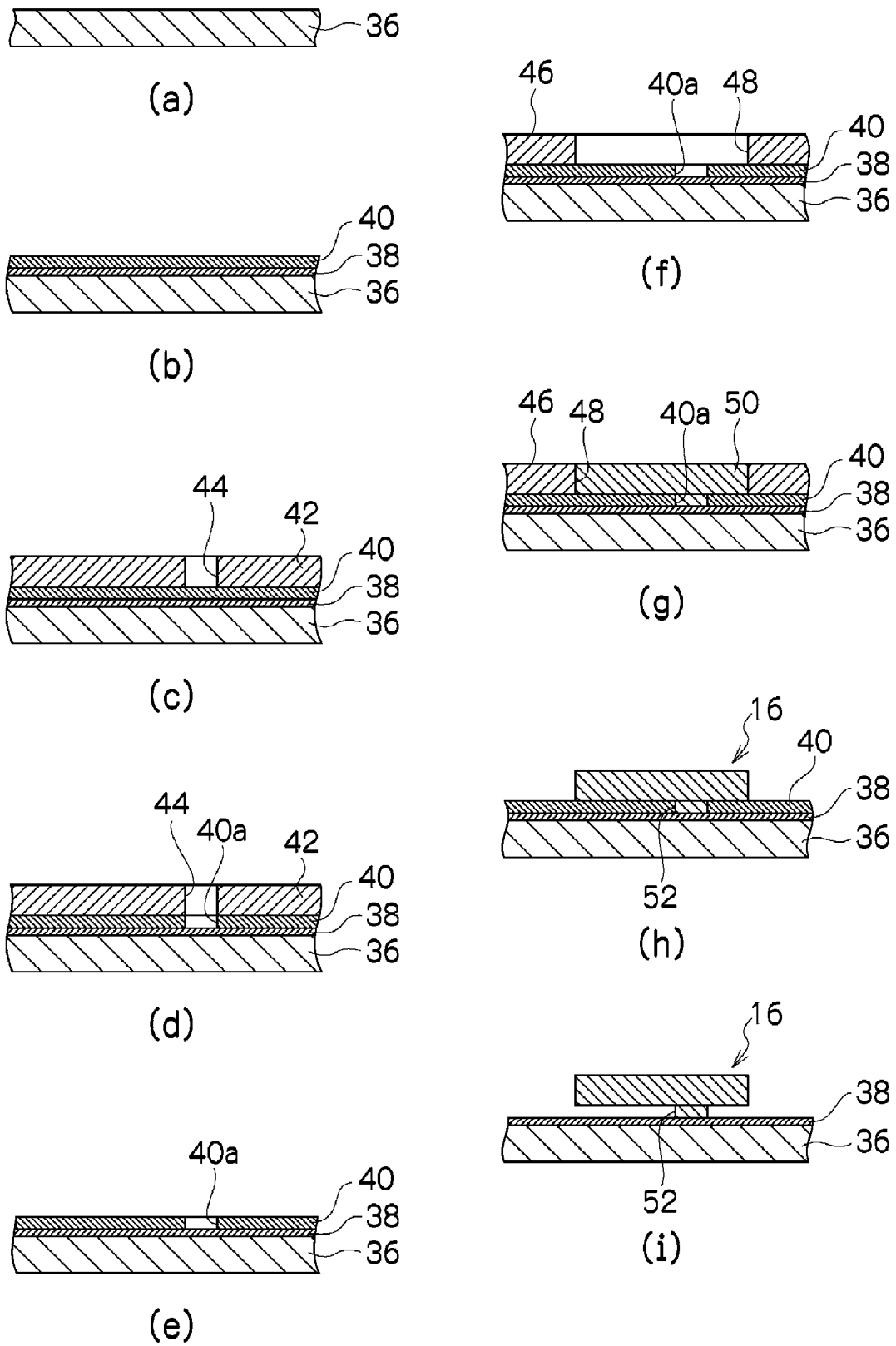
FIG. 6 is a process diagram showing a probe manufacturing procedure according to the present invention.

In a probe manufacturing method according to the present invention, a silicon crystal substrate 36 is used as a base table, for example, and the plurality of probes 16 are integrally formed on the base table, as shown in FIG. 5. Steps for manufacturing each of these probes 16 are described with reference to FIG. 6.

As shown in FIG. 6(a), the silicon crystal substrate 36 whose surface has been mirror-finished by etching is prepared as a base table.

Prior to growth of, e.g., a copper sacrificial layer on the silicon crystal substrate 36, an adhesive layer 38 such as nickel is formed by, e.g., a sputtering technique to promote growth of the copper. On this adhesive layer 38 is suitably deposited the copper by the sputtering technique to form a sacrificial layer 40 (FIG. 6(b)).

A photoresist material, which is a photosensitive material, is coated on the sacrificial layer 40 by, for example, a spin coat technique so as to have uniform thickness, and thus a photoresist layer 42 is formed. The photoresist layer 42 is selectively exposed with use of a pattern mask (not shown) for formation of an opening 44 in the photoresist layer 42. Following this selective exposure, the photoresist layer 42 undergoes a development process, as a result of which the opening 44 is formed in the photoresist layer 42 (FIG. 6(c)).

The sacrificial layer 40 is partially removed by an etching process, using the photoresist layer 42 having formed therein the opening 44 as an etching mask. As etchant for this etching process, etchant consisting primarily of tetra amine copper chloride and marketed by Meltex Inc. under the trade name of "A-Process" can be used without being diluted, for example.

By this selective etching process for the sacrificial layer 40, an opening portion 40a penetrating the sacrificial layer in its plate thickness direction is formed in the sacrificial layer 40 corresponding to the opening 44.

By doing so, the adhesive layer 38 under the sacrificial layer 40 is exposed within the opening 44 (FIG. 6(d)). The adhesive layer 38 exhibits more excellent etching resistance characteristics against the aforementioned etchant than the sacrificial layer 40 made of copper does. Thus, it is possible to expose the adhesive layer within the opening 44 relatively easily and appropriately without the need for strict management of the etching process time and without removal of the adhesive layer 38.

After formation of the opening portion 40a in the sacrificial layer 40, the photoresist layer 42 is removed (FIG. 6(e)).

After removal of the photoresist layer 42, a new photoresist layer 46 is formed as shown in FIG. 6(f) by a similar photoresist process to one described with reference to FIG. 6(c). Then, this photoresist layer 46 undergoes selective exposure with use of a pattern mask (not shown) having a flat surface shape of the probe 16 and subsequently undergoes a development process.

As a result, a recess 48 having a flat surface shape of the probe 16 shown in FIG. 3 is formed in the photoresist layer 46. This recess 48 is formed in an area containing the opening portion 40a so that the opening portion 40a having a square cross-sectional shape, 30 $\square$m to 100 $\square\square$m on a side, for example, is located approximately at the center of the attachment portion 22 of the probe 16. Thus, a resist mask with the recess 48 having a flat surface shape corresponding to the flat surface shape of the probe 16 is formed on the silicon crystal substrate 36 by the photoresist layer 46. This resist mask (46) exposes the sacrificial layer 40 and the adhesive layer 38 on the bottom surface of the recess 48. Also, in the resist mask (46), respective hole-forming portions for the openings 32, the space 30, and the opening 34 are formed within the recess 48, although not shown in the figures.

Within the recess 48 of the resist mask (46) is deposited a conventionally well-known probe metal material 50 such as nickel, nickel-phosphor alloy, rhodium, or tungsten by, for example, an electroplating technique (FIG. 6(g)).

As a result of the deposition of the probe metal material 50 within the recess 48, the probe 16 shown in FIG. 3 is formed and fixed on the sacrificial layer 40 of the silicon crystal substrate 36. Also, since the opening portion 40a opened on the adhesive layer 38 is formed in the sacrificial layer 40, deposition of the probe metal material 50 in the recess 48 leads formation, to be integral with the probe 16, of a stem-like coupling portion 52 having a transverse cross-sectional shape corresponding to the flat surface shape of the opening portion 40a with a height dimension of 0.1 $\square$m, for example, at the attachment portion 22 of the probe 16 by the probe metal material 50 deposited in the opening portion 40a.

Since the stem-like coupling portion 52 is firmly coupled to the adhesive layer 38 via the opening portion 40a of the sacrificial layer 40, the probe 16 is reliably held on the silicon crystal substrate 36 at the coupling portion 52.

After the probe 16 with the coupling portion 52 is formed on the sacrificial layer 40, the photoresist layer 46 having functioned as a resist mask is removed (FIG. 6(h)). After removal of the photoresist layer 46, a wet etching process with use of etchant is performed for removal of the sacrificial layer 40 in order to detach the probe 16 from the silicon crystal substrate 36. In this wet etching process, the sacrificial layer 40, made of a different material from the probe 16 and the coupling portion 52, is selectively removed, as shown in FIG. 6(i).

In this etching process, since the openings 32, 34 as well as the space 30 are formed in the probe 16 as described above, the etching of the sacrificial layer 40 by the etchant progresses at their opening edges as well. Thus, since the etching of the sacrificial layer 40 is promoted by the aforementioned space 30 and openings 32 and 34, the sacrificial layer 40 can be removed reliably before the probe 16 is etched by the aforementioned etchant.

Also, since the coupling portion 52 is made of the same material as the probe 16, it will not be influenced by a strong etching effect by the aforementioned etchant, but it is possible to remove the sacrificial layer 40 while the coupling portion 52 holding the probe 16 on the silicon crystal substrate 36 via the adhesive layer 38 reliably remains.

Accordingly, by detaching the coupling portion 52 of the probe 16 from the silicon crystal substrate 36 with use of a tool such as a cutter knife after removing the sacrificial layer 40, the probe 16 can be detached from the silicon crystal substrate 36 without the need for a large external force enough to cause bending of the probe 16 and thus without causing deformation or damage on the probe 16.

In the foregoing description, the manufacturing method according to the present invention has been explained in terms of the example in which a single coupling portion has been formed at the attachment portion 22. Instead of this example, a second coupling portion or a second stem portion 52' may be formed at the probe tip portion 26 as shown by the dashed line in FIG. 3. The cross-sectional shape of this second stem portion is preferably made to be smaller than that of the coupling portion 52 or the first stem portion.

In a case where the first and second stem portions 52, 52' are provided, the probe 16 is held on the silicon crystal substrate 36 at two points, distanced from each other, for the first stem portion 52 of the attachment portion 22 and the second stem portion 52' of the probe tip portion 26 when the sacrificial layer 40 is removed as shown in FIG. 6(i).

In the state where the probe 16 is held on the silicon crystal substrate 36 at these two points (52, 52') distanced from each other, the probe 16 can undergo heat treatment. This heat treatment reinforces strength of the probe 16. At the same time, a retroflexion force is introduced to the probe 16 due to the application of heat. However, as described above, since the probe 16 is held on the silicon crystal substrate 36 at the two points distanced from each other, the deformation of the probe 16 is restricted. Thus, the deformation with the retroflextion of the probe 16 caused by the heat treatment is suitably prevented.

After the aforementioned heat treatment, a second etching process similar to the aforementioned one is performed to the probe 16, and the second stem portion 52' is removed. At this moment, the main body of the probe 16 and the first stem portion 52 are also etched slightly. However, by setting the cross-section of the second stem portion 52' to be smaller than that of the first stem portion 52, the second stem portion 52' can be removed in the resumed etching process before the main body of the probe 16 suffers substantial damage and before the first stem portion 52 is removed.

Thus, by forming the second stem portion 52' having a smaller cross-sectional shape than that of the first stem portion or the coupling portion 52 in addition to the first stem portion 52, the probe 16 can undergo heat treatment without introducing heat deformation caused by the heat treatment to the probe 16. Also, after the second stem portion 52' is removed in the second etching process, each probe 16 can be detached from the silicon crystal substrate 36 relatively easily in a state where each probe 16 is held on the silicon crystal substrate 36 at the remaining first stem portion 52. Thus, the probe 16 can be formed relatively easily without deforming the probe 16 by the detachment force from the silicon crystal substrate 36.

The opening 32, the opening 34, etc. may be eliminated from the probe 16. However, as described above, it is preferable to form the aforementioned openings 32, 34 for the purpose of promoting etching at the opening edges at the time of removal of the sacrificial layer 40 by the etching.

Also, in the above example, heat treatment is performed between the first etching process and the second etching process. However, the heat treatment may be eliminated.

The present invention is not limited to the above embodiments but may be altered in various ways without departing from the spirit and scope of the present invention. For example, the adhesive layer 38 may be eliminated depending on the relationship between the base table 36 and the probe metal material 50. Also, various kinds of etchant can be selected and used depending on the relationship between the probe metal material 50 and the sacrificial layer 40.

What is claimed is:

1. A probe manufacturing method comprising the steps of:
   forming a sacrificial layer on a base table;
   partially removing said sacrificial layer so as to form a recess in said sacrificial layer;
   forming on said sacrificial layer a mask that exposes an area formed in a desired probe flat surface shape containing said recess on said sacrificial layer;
   depositing in said area exposed from said mask a probe material exhibiting different etching resistance characteristics from those of said sacrificial layer to form a coupling portion corresponding to said recess and a probe that is integral with said coupling portion;
   after removing said mask, removing said sacrificial layer with use of etchant against which said probe material exhibits more excellent etching resistance characteristics than said sacrificial layer does; and
   detaching from said base table said probe held on said base table at said coupling portion together with said coupling portion.

2. The probe manufacturing method according to claim 1, wherein, prior to formation of said sacrificial layer on said base table, an adhesive layer that promotes growth of said sacrificial layer is formed on said base table, and said recess formed in said sacrificial layer exposes said adhesive layer at the bottom of said recess.

3. The probe manufacturing method according to claim 2, wherein said coupling portion is supported on said base table via said adhesive layer exposed on the bottom of said recess.

4. The probe manufacturing method according to claim 1, wherein said mask is formed by selective exposure and development of a photomask layer made of a photomask material.

5. The probe manufacturing method according to claim 1, wherein said probe material is nickel or nickel alloy, said sacrificial layer is copper, and said etchant is one consisting primarily of tetra amine copper chloride.

6. The probe manufacturing method according to claim 1, wherein said probe is an entirely plate-shaped probe comprising an attachment portion having an attachment end to a probe substrate, an arm portion extending in a lateral direction from said attachment portion, and a probe tip portion extending to an opposite side of a side where said attachment end of said attachment portion is located and provided with a probe tip at its tip end.

7. The probe manufacturing method according to claim 6, wherein said coupling portion is a first stem portion formed at a part corresponding to said attachment portion of said probe.

8. The probe manufacturing method according to claim 7, wherein a second stem portion is further formed at a part corresponding to said probe tip portion of said probe, and the flat surface shape of said stem portion is smaller than the flat surface shape of said first stem portion formed at a part corresponding to said attachment portion.

9. The probe manufacturing method according to claim 8, wherein, after the etching process removing said sacrificial layer by said etchant, said probe material undergoes heat treatment in a state where said probe is supported on said base table at two points by said both stem portions.

10. The probe manufacturing method according to claim 9, wherein, after said heat treatment, said second stem portion is removed by an etching process, and said probe held on said base table at the remaining first stem portion is detached from said base table.

* * * * *